United States Patent
Bruchhaus et al.

(10) Patent No.: US 6,773,986 B2
(45) Date of Patent: Aug. 10, 2004

(54) METHOD FOR FABRICATING A SEMICONDUCTOR MEMORY DEVICE

(75) Inventors: Rainer Bruchhaus, Kanagawa-Pref (JP); Gerhard Enders, Olching (DE); Walter Hartner, Glen Allen, VA (US); Matthias Krönke, Dresden (DE); Thomas Mikolajick, München (DE); Nicolas Nagel, Naka-Ku Yokohama (JP); Michael Röhner, München (DE)

(73) Assignee: Infineon Technologies AG, Munich (DE)

( * ) Notice: Subject to any disclaimer, the term of this patent is extended or adjusted under 35 U.S.C. 154(b) by 58 days.

(21) Appl. No.: 10/186,662

(22) Filed: Jul. 1, 2002

(65) Prior Publication Data

US 2003/0058700 A1 Mar. 27, 2003

(30) Foreign Application Priority Data

Jun. 29, 2001 (DE) .......................................... 101 31 492

(51) Int. Cl.[7] .......................................... H01L 21/8242
(52) U.S. Cl. ...................................... 438/253; 438/233
(58) Field of Search .......................................... 438/239

(56) References Cited

U.S. PATENT DOCUMENTS 5,320,975 A * 6/1994 Cederbaum et al. ......... 438/153
6,555,431 B1 * 4/2003 Xing et al. .................. 438/253

FOREIGN PATENT DOCUMENTS

| DE | 195 43 539 C1 | 4/1997 |
| DE | 19543539 C1 * | 4/1997 |
| DE | 198 34 649 C1 | 3/2000 |
| DE | 19834649 C1 * | 3/2000 |
| JP | 05 343 615 A | 12/1993 |

* cited by examiner

Primary Examiner—David Nelms
Assistant Examiner—Thao P. Le
(74) Attorney, Agent, or Firm—Laurence A. Greenberg; Werner H. Stemer; Ralph E. Locher

(57) ABSTRACT

To achieve a highest possible integration density in a semiconductor memory device having storage capacitors as storage elements, the method according to the invention forms the capacitor devices in substantially vertically extending fashion, to, as a result, achieve a substantially three-dimensional configuration and an configuration extending into the third dimension for the capacitor devices, a contact connection of the storage capacitors being formed after the production of the storage capacitors.

25 Claims, 9 Drawing Sheets

METHOD FOR FABRICATING A SEMICONDUCTOR MEMORY DEVICE

BACKGROUND OF THE INVENTION

Field of the Invention

The invention relates to a method for fabricating a semiconductor memory device.

In modern semiconductor memory devices, in particular, in chain FeRAM memories or the like, a plurality of capacitor devices are provided as storage elements in the form of a capacitor configuration in the region of a semiconductor substrate or the like and/or of a passivation region and/or of a surface region thereof.

An objective of the ongoing development of modern semiconductor memory technologies is, inter alia, the formation of the most extensive integration density possible. Conventional semiconductor memory devices that use capacitor devices as storage elements are limited with regard to the integration density to the effect that the capacitor devices used should not fall below a certain minimum size, and, thus, a minimum lateral extent, for their functioning as storage capacitors or storage elements. Consequently, even with minimum distance separating conventional capacitor devices, there is a resultant limit in the area density of storage elements that cannot be undershot. In this case, the respective minimum separating distance is given in each case by the minimum feature size of the respective lithographic technique.

SUMMARY OF THE INVENTION

It is accordingly an object of the invention to provide a method for fabricating a semiconductor memory device that overcomes the hereinafore-mentioned disadvantages of the heretofore-known devices and methods of this general type and that achieves a particularly high integration density in conjunction with functional reliability.

With the foregoing and other objects in view, there is provided, in accordance with the invention, a method for fabricating a semiconductor memory device. The method includes, forming semiconductor substrate, a passivation region, and/or a surface region with a CMOS structure. A capacitor configuration of a plurality of capacitor devices serving as storage elements is formed in a region of the semiconductor substrate, the passivation region, and/or the surface region. Respective capacitor devices are formed and/or patterned partially and/or locally in a substantially vertically extending fashion with respect to the horizontally extending semiconductor substrate, the passivation region, and/or the surface region, and, as a result, forming and/or patterning a three-dimensional configuration extending partially and/or locally into a third dimension with respect to the semiconductor substrate, the passivation region, and/or the surface region for a respective one of the capacitor devices. A contact connection of the capacitor devices and of the electrode devices is formed with the CMOS structure by plug regions after production of the capacitor devices. Preferably, the method fabricates a chain FeRAM memory.

In the method for fabricating a semiconductor memory device, in particular, a chain FeRAM memory or the like, firstly a semiconductor substrate or the like, a passivation region, and/or a surface region thereof with a CMOS structure are formed. Such a configuration is fundamental for the circuit of the semiconductor memory device. Furthermore, a capacitor configuration of a plurality of capacitor devices serving as storage elements is formed in the region of the semiconductor substrate or the like, the passivation region, and/or the surface region thereof.

Furthermore, in accordance with another mode of the invention, the capacitor device is respectively formed and/or patterned in a fashion extending at least partially and/or locally substantially vertically or perpendicularly to the substrate with respect to the, in particularly, substantially horizontally extending, semiconductor substrate or the like, the passivation region, and/or the surface region thereof. Furthermore, it is provided according to the invention that, as a result, in particular, in each case a substantially three-dimensional configuration or structure and/or an configuration or structure extending at least partially and/or locally substantially into the third dimension with respect to the, in particular, substantially horizontally extending, semiconductor substrate or the like, the passivation region, and/or the surface region thereof, is formed and/or patterned for the respective capacitor device.

It is, thus, a fundamental idea of the method according to the invention to form and/or to pattern the respective capacitor devices such that they run substantially in vertically extending fashion with respect to the surface of the semiconductor substrate or the like. What is thereby achieved is that the integration density and, thus, the area of the entire cell array is no longer dominated by the required area proportion of the electrode areas, but rather ultimately substantially by the resolution and the feature size of the patterning method during the formation of the capacitor configuration. In principle, the possibility is, thus, afforded of orienting the feature size or minimum lateral extent of a capacitor device to the physically required layer thicknesses for the capacitor electrodes and the dielectric.

In such a case, a first and a second electrode device and also a dielectric—substantially provided between the latter—of the respective capacitor device are respectively formed and/or patterned at least partially and/or locally in a fashion extending substantially vertically or perpendicularly to the substrate with respect to the, in particular, substantially horizontally extending, semiconductor substrate or the like, the passivation region, and/or the surface region thereof. This is done such that, in this case, in particular, the sequence of first electrode device, dielectric, and second electrode device of the respective capacitor device is formed at least partially and/or locally in substantially horizontally extending fashion with respect to the, in particular, substantially horizontally extending, semiconductor substrate or the like, the passivation region and/or the surface region thereof, in a form disposed one beside the other in the surface region of the semiconductor substrate and/or of the passivation region thereof.

In the text above and below, the term dielectric always means the central dielectric of the storage capacitor/the capacitor device and/or the so-called node dielectric. This is, in particular, a ferroelectric (SBT, PZT, . . . ), a paraelectric, or the like.

In accordance with a further mode of the invention, the, in particular, substantially horizontally extending, semiconductor substrate or the like, and/or the surface region thereof and, in particular, the CMOS structure are at least partially covered and/or embedded by at least one first substantially top-situated and/or substantially laterally extending passivation region made of a substantially electrically insulating material, in a two-dimensional, large- and/or whole-area manner and/or with a planar surface region. Such a measure creates an isolation between the actual semiconductor substrate and the CMOS structure formed therein, and the capacitor configuration that is to be disposed thereabove. The passivation region is deposited, in particular, in a substantially two-dimensional, large- and/or whole-area manner and/or, in particular, with a planar surface.

In accordance with an added mode of the invention, a contact connection for the capacitor devices to be formed and particularly for their electrode devices to be formed with the CMOS structure is formed by contact regions or plug regions substantially after the formation of the capacitor devices.

In accordance with an additional mode of the invention, at defined first regions and/or at defined first locations in the first, substantially top-situated, passivation region, cutouts are formed, in particular, by a, preferably selective, etching process or the like and/or, in particular, in a manner spaced apart substantially vertically from the level of the semiconductor substrate and/or of the surface region thereof. In such a case, in particular, substantially electrically insulating elevated regions are formed in the first passivation region at second defined regions or locations between the first defined regions or locations.

Regions substantially above and between source/drain regions of selection transistor devices provided in the surface region of the semiconductor substrate and/or substantially between defined second regions or locations of contact regions or plug regions to be provided for the contact connection of the capacitor configuration to be formed with the CMOS structure of the semiconductor substrate or the like and/or of the surface region thereof are chosen, in particular, as defined first regions or as defined first locations.

In accordance with yet another mode of the invention, the cutouts are formed vertically from the level of the surface region of the semiconductor substrates, and, in particular, from the level of source/drain regions, gate and/or word line regions of selection transistor devices provided.

Furthermore or as an alternative, in accordance with yet a further mode of the invention, the cutouts are formed laterally at least partially at least as far as edge regions of plug regions or contact regions to be provided. In addition, it is provided in such a case that, as a result, edge regions of the cutouts formed are provided as edge regions of the plug regions or contact regions to be provided. What is achieved by these measures is that the edges or walls of the cutouts simultaneously form edges or walls of the plugs to be provided. This is particularly advantageous with regard to the configuration of the contact connection with the electrode devices.

Afterward, in accordance with yet an added mode of the invention, at least one material region for the electrode devices is then deposited. This is done, in particular, using at least one substantially electrically conductive material, for example, a metal, a metal oxide, and/or the like. Furthermore, the material region for the electrode devices is preferably deposited in a conformal manner, in the form of a two-dimensional deposition technique, in a large- and/or whole-area manner, in particular, edge regions of the cutouts and/or the elevated regions being lined and/or covered.

Consequently, by the measures outlined above, the capacitor configuration with the plurality of capacitor devices is fundamentally pre-patterned, a contact connection of the electrode devices of the capacitor devices with the plug regions and the CMOS structure formed underneath being inherently ensured.

In such a case, an isolation of the electrode devices that are not to be contact-connected may optionally be necessary.

This is realized, in particular, by virtue of the fact that at least substantially laterally extending regions of the material region for the electrode devices are eroded and removed to the level, in particular, by an anisotropic etching-back or the like.

As a result, in particular, substantially vertically extending regions are formed adjacent to the insulating elevated regions. These vertically extending regions of substantially electrically conductive material then form the electrode devices of the capacitor devices.

In accordance with yet an additional mode of the invention, if appropriate, the barrier and/or insulation region for the dielectric is respectively formed in a plurality of layers. In addition or as an alternative it is provided that the barrier and/or insulation region for the dielectric is formed in a topmost region—substantially remote from the semiconductor substrate or the like—and/or the surface region thereof in each case as nucleation layer for the dielectric that is subsequently to be applied.

In accordance with again another mode of the invention, on lateral bottom regions or the like of the cutouts, in each case a barrier and/or insulation region for the dielectric to be provided is formed, in particular, by specific and/or anisotropic, that is to say, substantially directed, deposition, and/or, in particular, using at least one substantially electrically insulating material.

The barrier and/or insulation region for the dielectric may also be deposited before the elevated plugs, followed by an etching step with a stop on the nucleation layer. Conformal deposition onto the elevated plugs is appropriate as an alternative.

Furthermore, preference is attached to the fact that—in particular, on the respective barrier and/or insulation region for the dielectric—a material region for the dielectric is deposited, in particular, in the form of a ferroelectric, a material that forms a ferroelectric—in particular, following an annealing process, or the like, in particular, in a two-dimensional form, conformal form, large-area form, whole-area form and/or a form that fills the first cutouts as far as the level of the surface region of the first passivation region, and/or by subsequent polishing as far as the level of the surface region of the first passivation region. This is done, in particular, to form a respective region for the dielectric between the electrode devices.

Afterward, in accordance with again a further mode of the invention, the material layer for the dielectric and/or the dielectric may be subjected to a heat treatment process, in particular, at elevated temperature and/or in a defined process atmosphere, which contains, in particular, oxygen or the like, to be precise without damaging the regions below the layer for the barrier and/or insulation region for the dielectric.

In accordance with again an added mode of the invention, second cutouts are formed at the defined second regions or the defined second locations, in particular, above the source/drain regions of the selection transistor devices. This is done, in particular, by a, preferably selective, etching process or the like. In such a case, in particular, the substantially electrically insulating elevated regions are substantially removed such that side regions or edge regions of the electrode devices are uncovered at least in part.

Furthermore, in this case, in particular, the barrier region and also the first passivation region in the region of the second defined locations or second defined regions are eroded as far as the level of the surface region of the semiconductor substrate such that the surface region of the source/drain regions is uncovered in each case.

This has the advantage, in particular, in accordance with again an additional mode of the invention, that a material region of a substantially electrically conductive material can be deposited, to be precise, optionally after formation of a liner or the like and/or optionally after formation of a hard mask that protects the ferroelectric, in particular, in a two-dimensional form, conformal form, large-area form, whole-area form, and/or a form that fills the second cutouts in each case as far as the level of the surface region of the source/drain regions, and/or by optional subsequent polishing or the like as far as the level of the surface regions of the electrode devices and/or of the dielectric or optionally as far as the hard mask. In such a case, it is provided, in particular, that, as a result, first electrode devices or second electrode devices that are opposite one another in the second cutouts are in substantially electrically conductive contact together with the respective source/drain regions.

In accordance with still another mode of the invention, at least some of the capacitor devices are contact-connected by their respective first electrode device through a first contact element to the first electrode device of a first substantially electronically adjacent capacitor device and by their second electrode device through a second contact element to the second electrode device of a second substantially directly spatially adjacent capacitor device of the capacitor configuration, in order to form a capacitor configuration with an at least partly connected or chain structure. In this case, it is furthermore provided, in particular, that the first electrode devices that are contact-connected to one another and/or the second electrode devices are in each case formed as a substantially contiguous and/or integral or one-part electrically conductive region. This is done, in particular, together with a respective first contact element or the like and/or, in particular, in each case together with a plug region or contact region or the like.

In the case of the device, it is provided that, in particular, in chain FeRAM memories or the like, the capacitor device is respectively formed in a fashion extending at least partially and/or locally substantially vertically or perpendicularly to the substrate with respect to the, in particularly substantially horizontally extending, semiconductor substrate or the like, the passivation region, and/or the surface region thereof, and that, as a result, in particular, in each case a substantially three-dimensional configuration or structure and/or an configuration or structure extending at least partially and/or locally substantially into the third dimension with respect to the, in particular, substantially horizontally extending, semiconductor substrate or the like, the passivation region, and/or the surface region thereof, is formed for the respective capacitor device.

It is, thus, a central concept of the present invention to vertically orient the storage capacitors of the capacitor configuration of the semiconductor memory device—in contrast to the conventional configuration in which the capacitor devices are formed horizontally or in laterally extending fashion. Specifically, the area of the respective capacitor device is then determined and given, not by the electrode areas, but rather ultimately by the respective layer thicknesses that are required for the electrode devices and for the dielectric. This means that a further increase in the integration density can be achieved, because the required area proportions for the electrodes and for the dielectric are provided by the three-dimensional patterning.

In such a case, the respective capacitor devices in each case have a first electrode device, a second electrode device and a dielectric substantially provided between the latter.

In an advantageous manner, the capacitor device is in each case formed as a stack structure or has such a structure, thereby resulting in a particularly compact construction, which can only be realized in an inadequate manner in the case of an offset structure.

It is provided, in particular, that the electrode device and/or the dielectric of the respective capacitor device are formed at least partially and/or locally in a fashion extending substantially vertically or perpendicularly to the substrate in each case with respect to the, in particular, substantially horizontally extending, semiconductor substrate or the like and/or with respect to an insulation region or passivation region and/or with respect to the surface region thereof. In this case, it is provided, in particular, that the sequence of first electrode device, dielectric, and second electrode device of the respective capacitor device is formed at least partially and/or locally in substantially horizontally extending fashion with respect to the, in particular, substantially horizontally extending, semiconductor substrate or the like and/or with respect to an insulation region or passivation region and/or with respect to the surface region thereof, in particular, in a form disposed one beside the other in the surface region of the semiconductor substrate or the like and/or of an insulation region or passivation region thereof. In accordance with this measure, it is provided, then, that the sequence of the electrode devices and the dielectric forms, as it were, a stack that is perpendicular to the surface of the semiconductor substrate or the passivation region thereof, the sequence, that is to say, the stack direction, extending in the horizontal direction and the respective regions, namely the first and second electrodes and the dielectric provided between the latter running perpendicularly.

In an advantageous manner, the dielectric in each case has a ferroelectric and/or a paraelectric material or the like or is formed from such a material.

It is furthermore preferably provided that the capacitor configuration has, at least in part, a connected or chain structure of the capacitor devices. This form of the connection of the capacitor devices and the latters' utilization of common electrode devices is particularly space-saving and, thus, supports the formation of the highest possible integration densities.

In accordance with still a further mode of the invention, to realize the chain structure discussed above, at least some of the capacitor devices are formed in a manner contact-connected by their respective first electrode device through a first contact element to the first electrode device of a first substantially directly spatially adjacent capacitor device and by their second electrode device through a second contact element to the second electrode device in the second substantially spatially directly adjacent capacitor device of the capacitor configuration.

The contact elements can also be referred to as contact or junction regions. Preferably, in this case, the first electrode devices and/or second electrode devices that are in each case contact-connected to one another in each case form a substantially contiguous, one-part and/or integral electrically conductive region. This can be done, for example, by forming the respective contact-connected electrode devices, for example, in the form of a contiguous metal region or the like. On the other hand, it is conceivable for the electrode devices that are contact-connected to one another to form in each case separate conductive, for example, metallic, regions that are contact-connected to one another through a respectively provided first or second contact element. An interaction of the electrodes with parts of the plug regions may also be provided.

For the contact connection and/or interconnection of the capacitor configuration and/or, in particular, of the capacitor devices, in particular, the electrode devices, in the semiconductor substrate or the like and/or in a covering layer or passivation layer and/or in the surface region thereof, a contact region or plug region is respectively provided, which is formed in a manner substantially electrically conductively contact-connected in each case, in particular, with the respective capacitor device, in particular, with the respective electrode device thereof. This means that the circuit underlying the semiconductor memory device, for example, in the form of a CMOS structure, is connected to the capacitor electrodes or electrode devices through the respective contact regions or plug regions. This is done, for example, by direct contact connection of the plug regions to the individual electrodes or to the first or contact elements provided, which connect the electrode devices to one another.

It is advantageously furthermore provided that the electrode devices are disposed and/or formed in each case substantially in a region in direct spatial proximity to the contact regions or plug regions, in particular, in a manner directly adjoining the latter and/or, in particular, directly above the latter on the surface region of the semiconductor substrate or a covering layer or passivation layer thereof.

The application and patterning of a dielectric is problematic, in principle, because a multiplicity of parameters must be optimized to realize desired electrical properties for the capacitor devices to be formed.

Accordingly, in accordance with still an additional mode of the semiconductor memory device according to the invention, it is provided that a barrier and/or insulation region for the dielectric, made of a substantially electrically insulating material, is provided between the dielectric and the region of the semiconductor substrate or the like and/or the passivation region and/or the surface region thereof. The material serves, on one hand, as mechanical contact layer and transition layer between the semiconductor surface or passivation surface and the dielectric. Furthermore, the electrical insulation of the dielectric from the semiconductor material and/or the passivation material continues to be ensured so that leakage currents are avoided to the greatest possible extent.

In such a case, the barrier and/or insulation region for the dielectric is optionally formed in a multilayer manner to achieve the functioning ascribed to it in a particularly favorable manner.

In accordance with a concomitant mode of the invention, at least the region facing the dielectric or the corresponding layer of the barrier and/or insulation region for the dielectric, that is to say, in particular, the surface region thereof, is formed as a nucleation layer or the like, to support and/or stabilize a desired structure, in particular, a crystal structure or the like, for the dielectric during processing and/or during operation of the semiconductor memory device. In particular, in this case, a crystal growth process is conceivable that is initiated on the surface region of the barrier and/or insulation region for the dielectric layer, that is to say, the nucleation step, and that, by virtue of its structure, controls and constrains a specific crystal geometry or crystal orientation during the production or during the growth and/or during heat treatment (after deposition) of the dielectric material.

Further aspects and advantages of the present invention emerge from the following remarks.

During the fabrication of ferroelectric capacitors for applications in nonvolatile semiconductor memories having a high integration density, a ferroelectric material is used as dielectric between the electrodes of a storage capacitor. This may involve materials such as $SrBi_2(Ta, Nb)_2O_9$ (SBT or SBTN), $Pb(Zr, Ti)O_3$ (PZT), or $Bi_4Ti_3O_{12}$ (BTO) or the like, or slight modifications. It is also possible to use paraelectric materials, for example (BA, Sr)$TiO_3$ (BST).

Because, after the deposition of the dielectric, the dielectric is subjected to a heat treatment process with regard to its crystal structure and its electromagnetic properties, the material for the electrodes should be able to withstand high temperatures in an oxygen-containing atmosphere. Noble metals or metallic oxides are, thus, appropriate. In particular, Pt, Pd, Ir, Rh, Ru, $RuO_x$, $IrO_x$, $RhO_x$, $SrRuO_3$, LSCO ($LaSrCoO_x$), high-temperature (HT) superconductors ($YBa_2Cu_3O_7$, ... or the like can be used.

Conventional semiconductor memory devices and, in particular, ferroelectric semiconductor memories are disadvantageous to the effect that their integration density is critically limited by the minimum requirements with regard to the electrode areas. This is due to the fact that the electrodes are disposed in horizontal orientation with respect to the surface of the semiconductor substrate or its passivation region.

Furthermore, the electrode devices of the capacitors are disposed substantially two-dimensionally as a result.

The basic concept of the present invention is the formation of a three-dimensional and/or vertical structure for ferroelectric storage capacitors for FeRAM memory modules, in particular, of the chain type.

In such a case, vertical means that the electrodes of the storage capacitors are disposed vertically or running vertically in or with respect to the ferroelectric. A three-dimensional vertical capacitor is simple to miniaturize because in such a case exclusively the layer thicknesses that are physically to be minimally complied with are a limiting factor for the integration density. A vertically disposed storage capacitor, therefore, requires a particularly small space on the surface of the semiconductor substrate. Consequently, a $4F^2$ cell is conceivable in the case of the chain concept with a vertical three-dimensional capacitor, F being the minimum feature size that can be achieved.

Other features that are considered as characteristic for the invention are set forth in the appended claims.

Although the invention is illustrated and described herein as embodied in a method for fabricating a semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the intermediate stages, shown in diagrammatic and cross-sectional side view in FIGS. 1 to 9, in the fabrication of a semiconductor memory device according to the invention identical or identically acting elements of the regions are designated by identical reference symbols, and their description is not repeated individually in detail for each figure.

Figure 1:
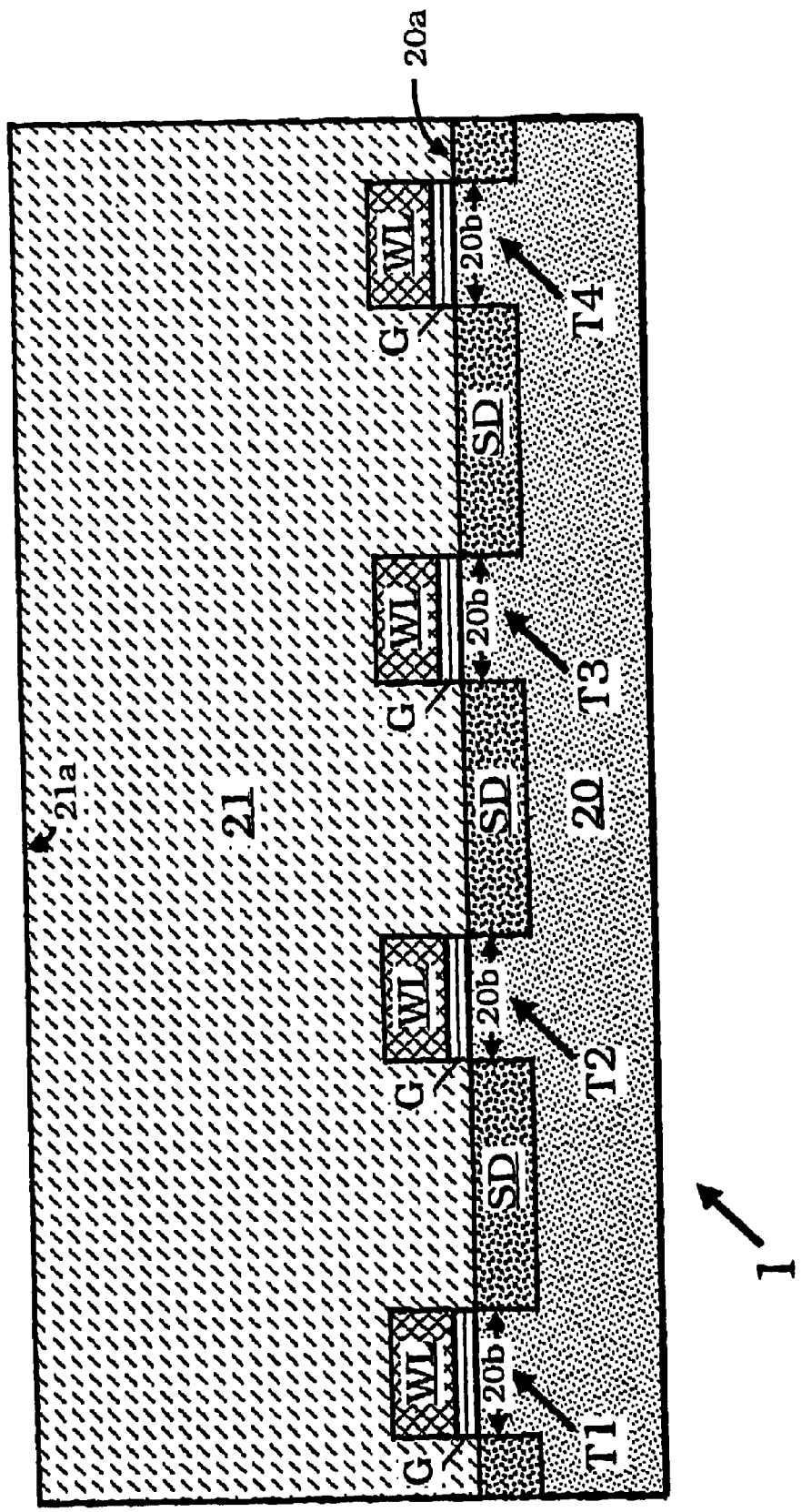
FIGS. 1 to 9 are fragmentary, cross-sectional views of intermediate steps occurring for manufacturing a semiconductor memory device according to the invention.

The configuration shown in lateral cross-sectional view in FIG. 1 is the starting point in the construction of the semiconductor circuit device 1 according to the invention in accordance with the fabrication method according to the invention.

In an actual semiconductor substrate 20, a CMOS structure serving for the interconnection of the semiconductor memory device 1 is formed in a series of preliminary processes. In a surface region 20a of the semiconductor substrate 20, selection transistor devices T1 to T4 are provided for the selection of the memory cells to be formed, i.e., for the driving of the storage capacitors 10-1, . . . , 10-4 that are to be correspondingly formed. Source/drain regions SD disposed in the surface region 20a of the semiconductor substrate 20 form the selection transistor devices. In this case, adjacent source/drain regions SD are disposed spaced apart from one another and are separated from one another by an intermediate region 20b in the surface region 20a of the semiconductor substrate 20.

Substantially electrically conductive word lines WL run above the intermediate regions 20b in the surface region 20a of the semiconductor substrate 20, in a manner electrically insulated by gate oxide regions G. The gate oxide regions G of the individual selection transistor devices T1 to T4, the regions thereby functioning as gate, are driven through the word lines WL. So-called contact regions, plug regions or plugs P made of substantially electrically conductive material are provided above the source/drain regions SD, that is to say, extending from the surface region 20a. The plugs P are in substantially electrically conductive contact with the source/drain regions SD.

The word lines WL, the gate oxide regions G, and also the plugs P (see FIGS. 8 and 9) are embedded in a passivation region 21 formed from a silicon oxide, for example. The surface region 21a of the passivation region 21 is situated opposite the surface region 20a of the actual semiconductor substrate 20. Consequently, the plugs P extend from the surface region 20a, namely in electrically switching contact with the source/drain regions SD, with their own surface region Pa as far as the surface region 21a of the passivation region 21.

The configuration and structure shown in FIG. 1 can be formed by standard methods, as are in the prior art.

Proceeding from the basic structure shown in lateral cross-sectional view in FIG. 1, the invention proceeds as follows to form the semiconductor memory device 1 according to the invention.

Figure 2:
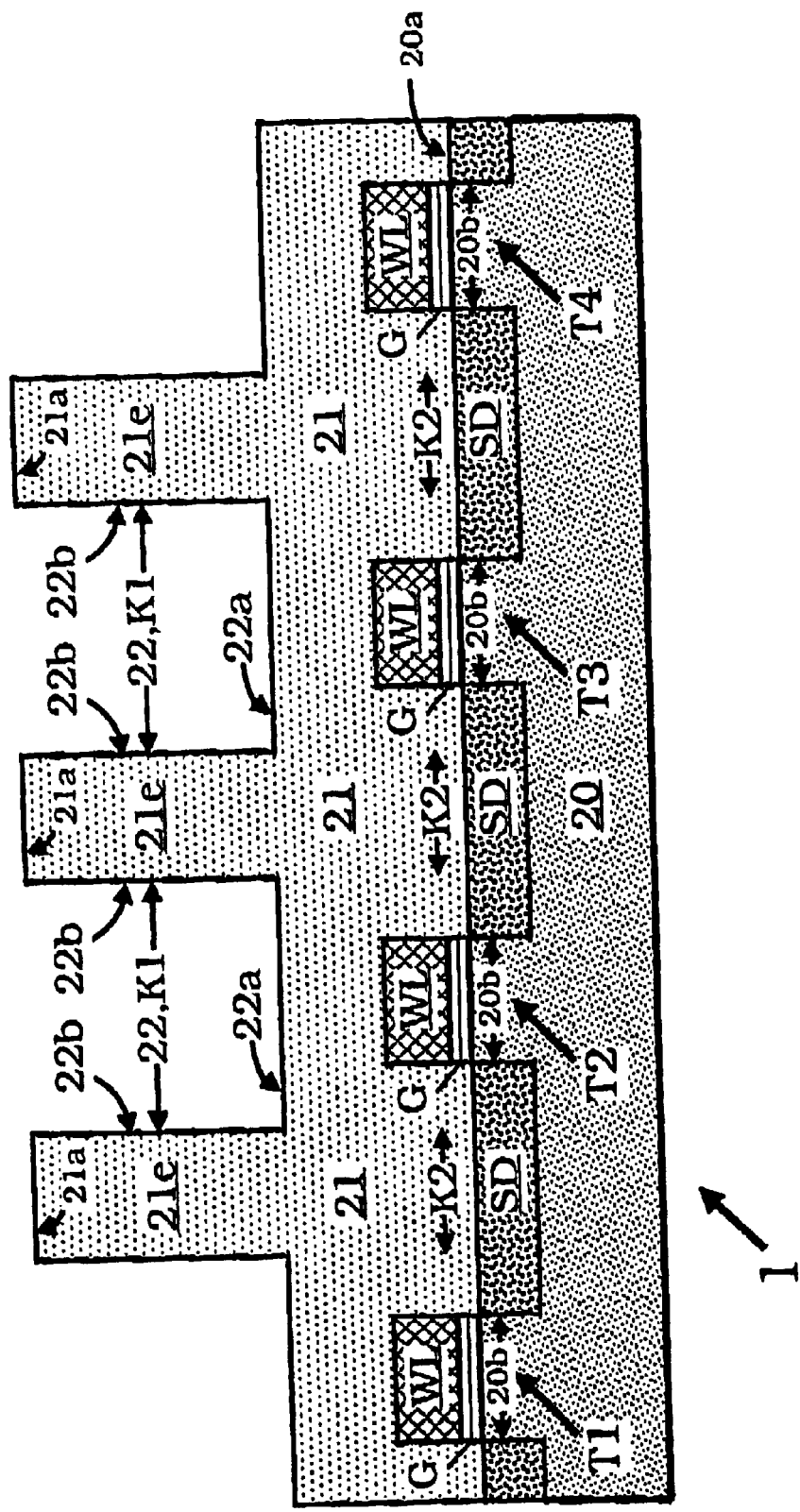

Within the context of a substantially anisotropic etching process or lithography step, a plurality of first cutouts 22 are formed in the first passivation region 21, to be precise at defined first locations K1 between the plug regions P to be formed and above the word lines WL and gate regions G of the selection transistors T1, . . . , T4. In this case, the first cutouts 22 extend in the vertical direction, proceeding from the surface 21a of the first passivation region 21, to above the level of the surface of the word lines WL. In the lateral direction, the edge regions 22b of the first cutouts 22 that have been formed form edge regions Pb of plugs that are to be formed. The first cutouts 22 are, thus, bounded by the edge regions 22b at the sides and, toward the bottom, by the bottom regions 22a and are otherwise open toward the top. Elevated regions 21e are, therefore, formed in the first passivation region 21, to be precise at the second locations K2 above the source/drain regions. This intermediate stage of the method according to the invention is shown in FIG. 2.

Figure 3:
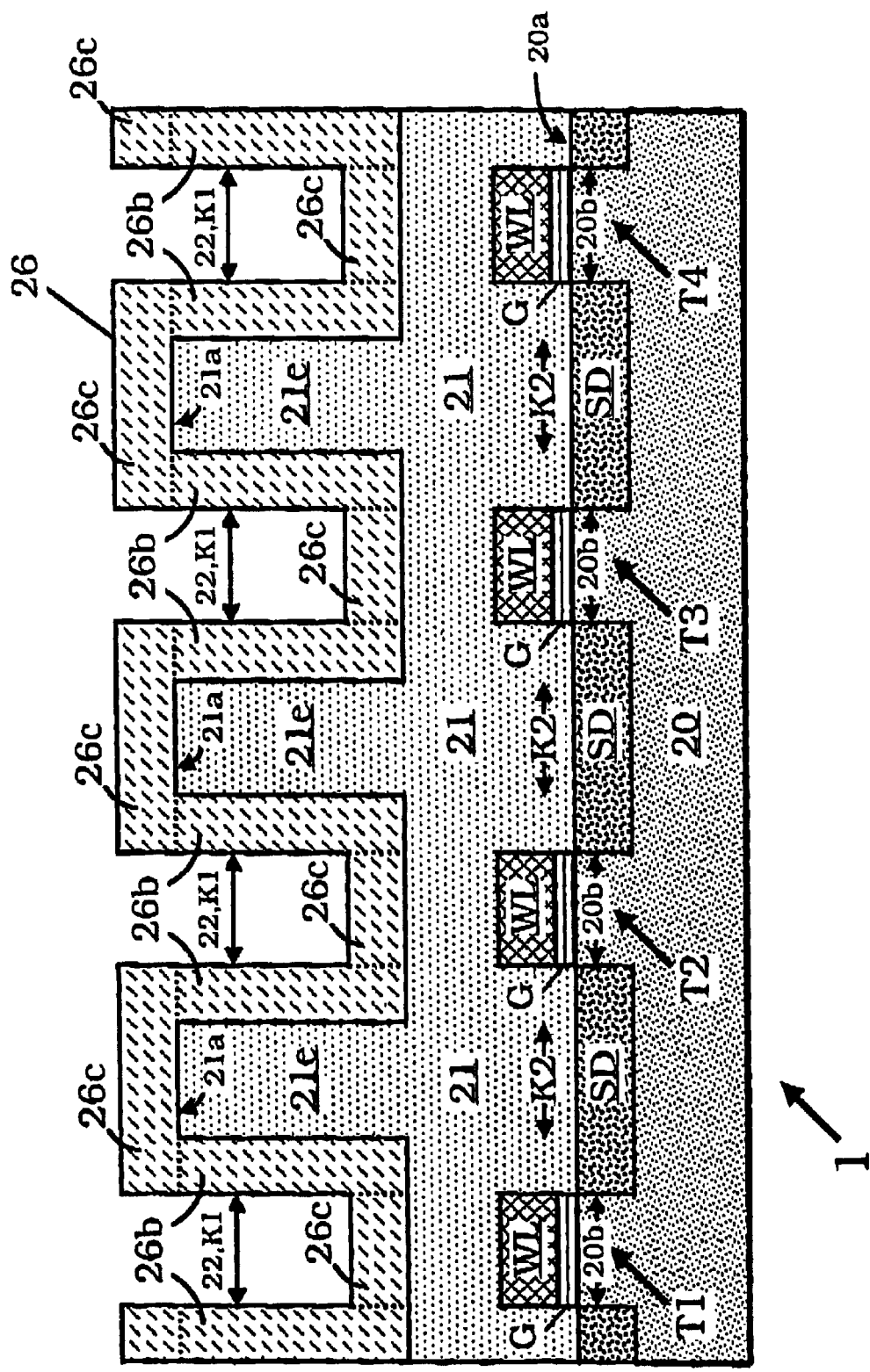

In the transition to FIG. 3, a material region 26 for the electrodes 14 and 18 to be formed (see FIG. 4) is then deposited in a two-dimensional, whole-area and conformal manner on the prepatterned surface sequence 22a, 22b, 21a, so that the material of the material layer 26 for the electrodes 14 and 18 follows the contour that substantially follows through the areas 22a, 22b, 21a. In this way, material sections 26b are formed in a lateral direction and 26c in a substantially vertical direction on this surface contour.

To isolate the conductive regions 26c from one another, the conformally formed material layer 26 is etched back in an anisotropic etching process such that the bottom regions 22a of the cutouts 22 and also there the surface of the first passivation region 21 are freed of the conductive material of the layer 26, in other words, the material regions 26b are completely removed, and the vertically running material regions 26c remain as first electrodes 14 and second electrodes 18 that are respectively electrically insulated from one another by the elevated regions 21e.

Figure 4:
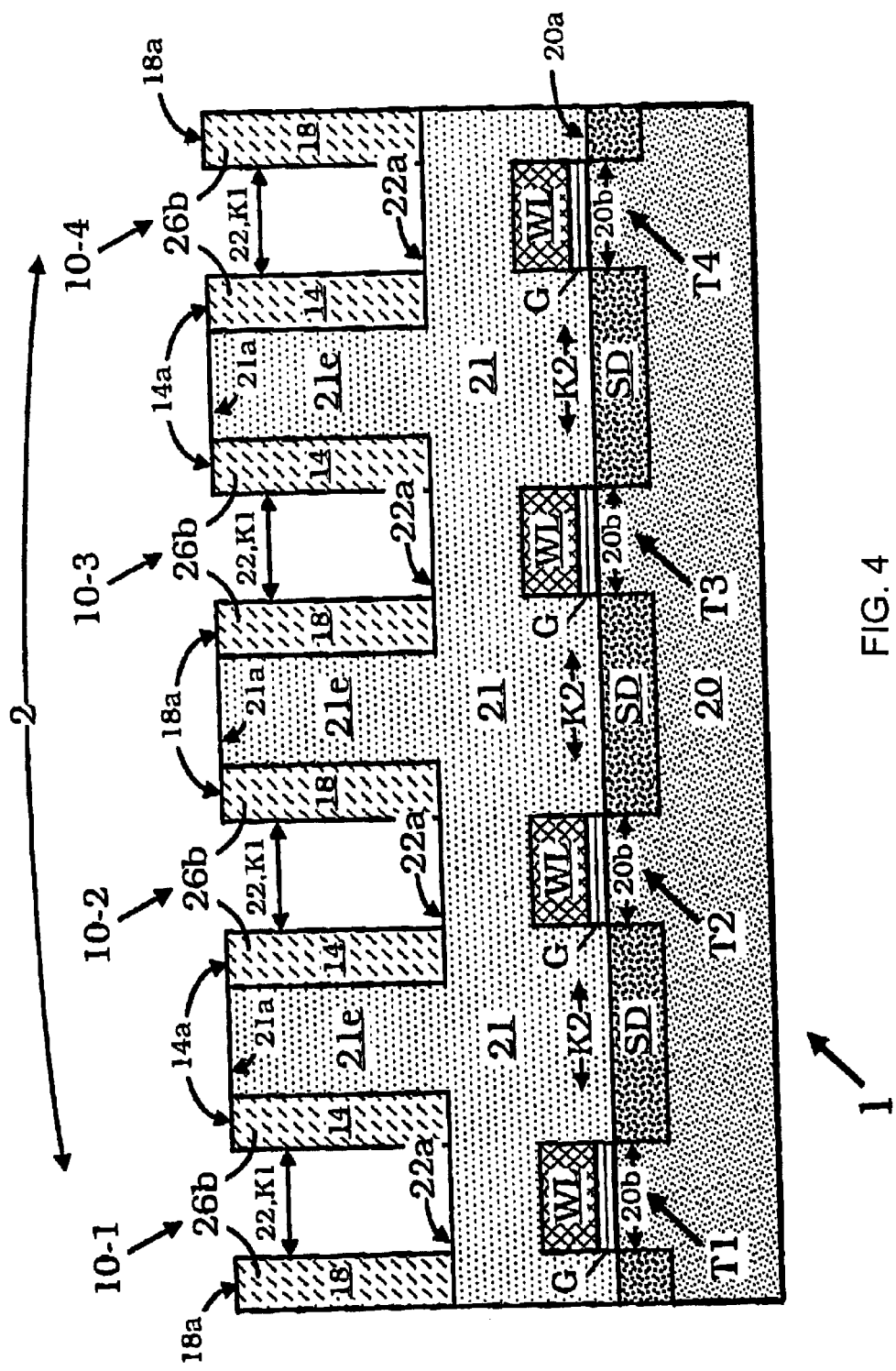

FIG. 4 shows this intermediate state in which the first and second electrodes 14 and 18, respectively, are in each case already formed in a manner isolated from one another.

Figure 5:
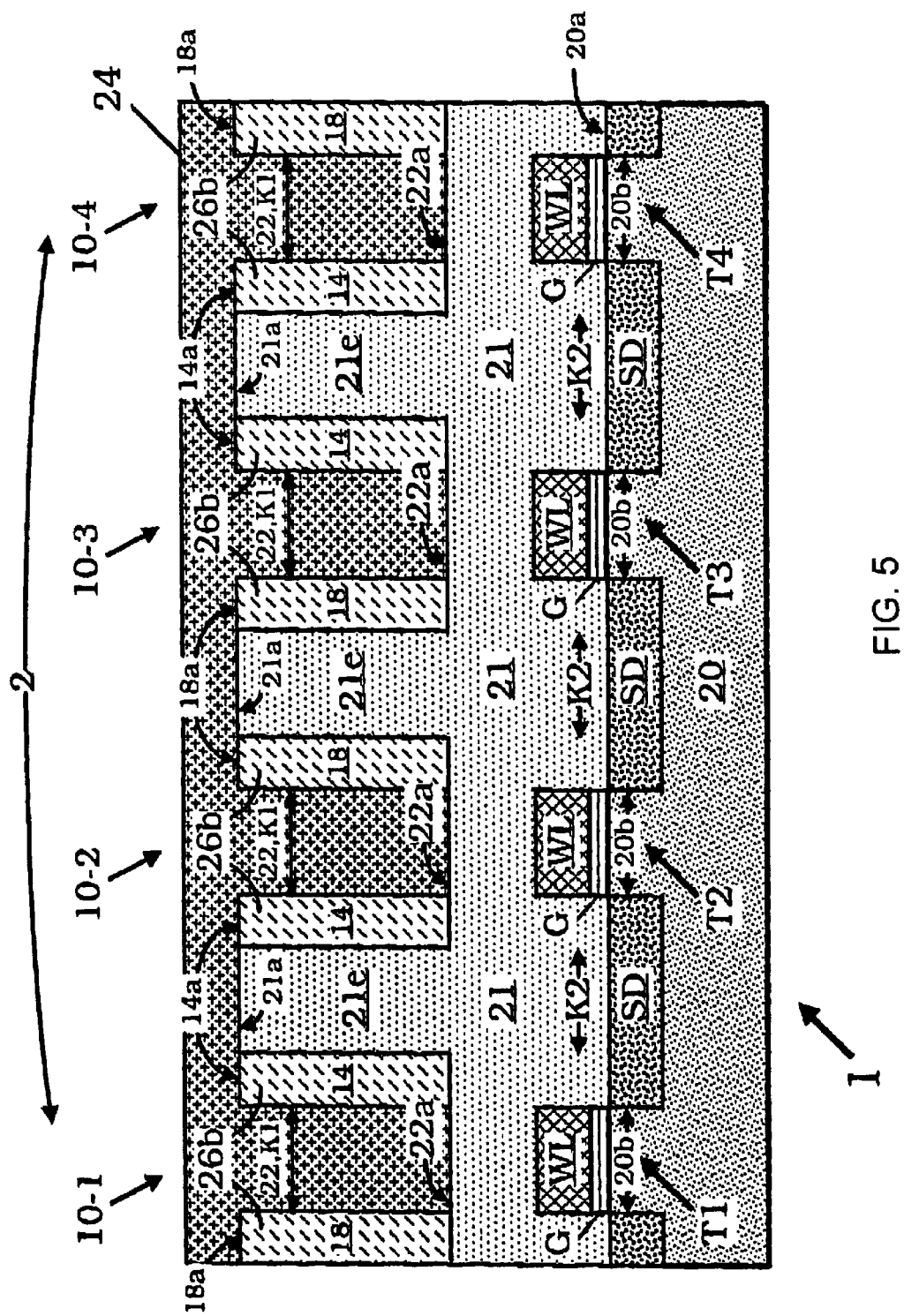
Figure 6:
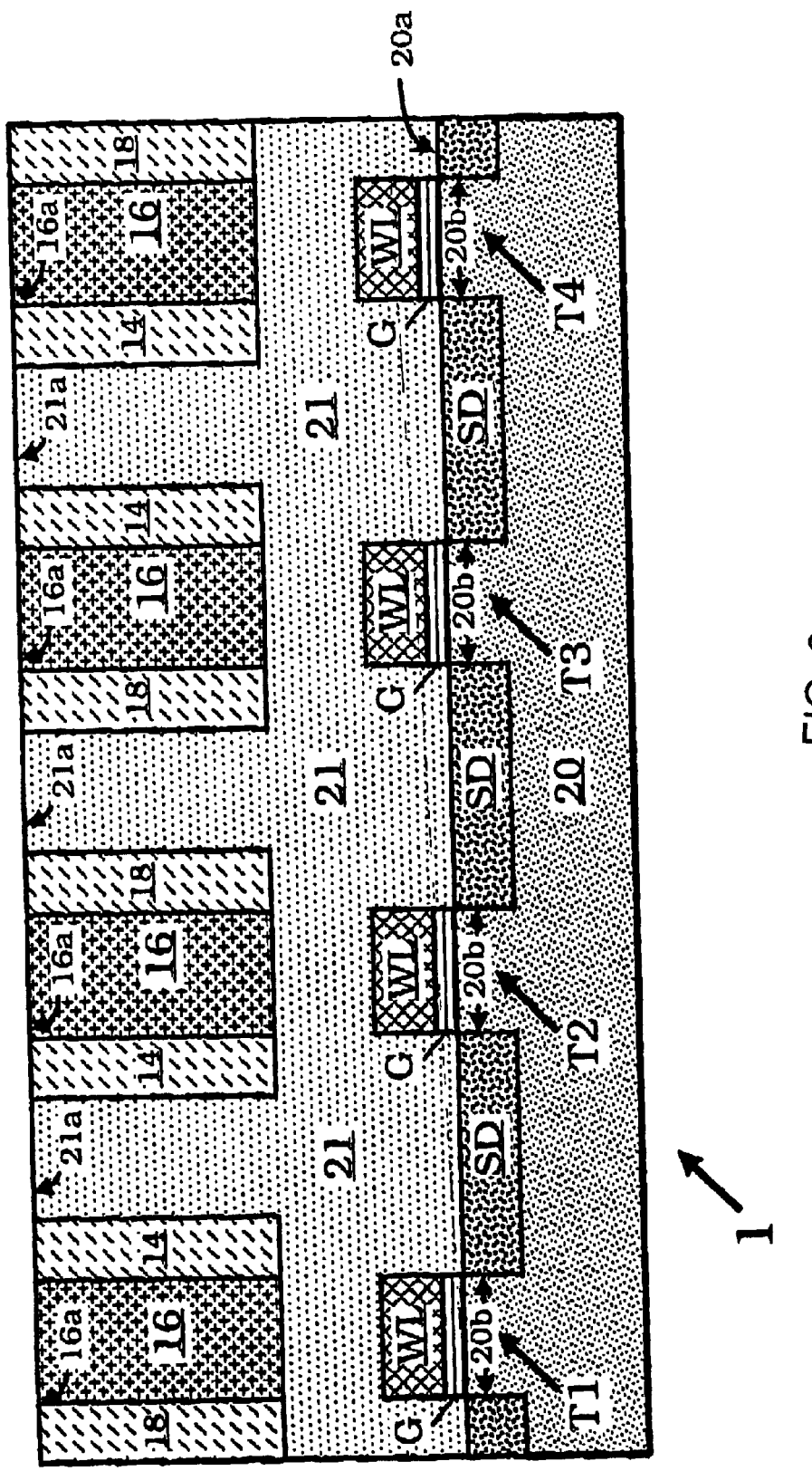

Proceeding from the intermediate state shown in FIG. 4, the cutouts 22 that have remained free are then filled with a corresponding dielectric 16, preferably a ferroelectric. This can be done by coating the prepatterned surface region with a corresponding material layer 24 in a substantially large-area or whole-area or 2D deposition method, so that, in particular, the cutouts 22 between the first and second electrodes 14 and 18 are filled beyond the level of the surface region 21a of the first passivation region 21. Afterward, a polishing step with a stop on the level of the surface region 21a of the first passivation region 21 was then carried out. These steps are shown in FIGS. 5 and 6.

Figure 7:
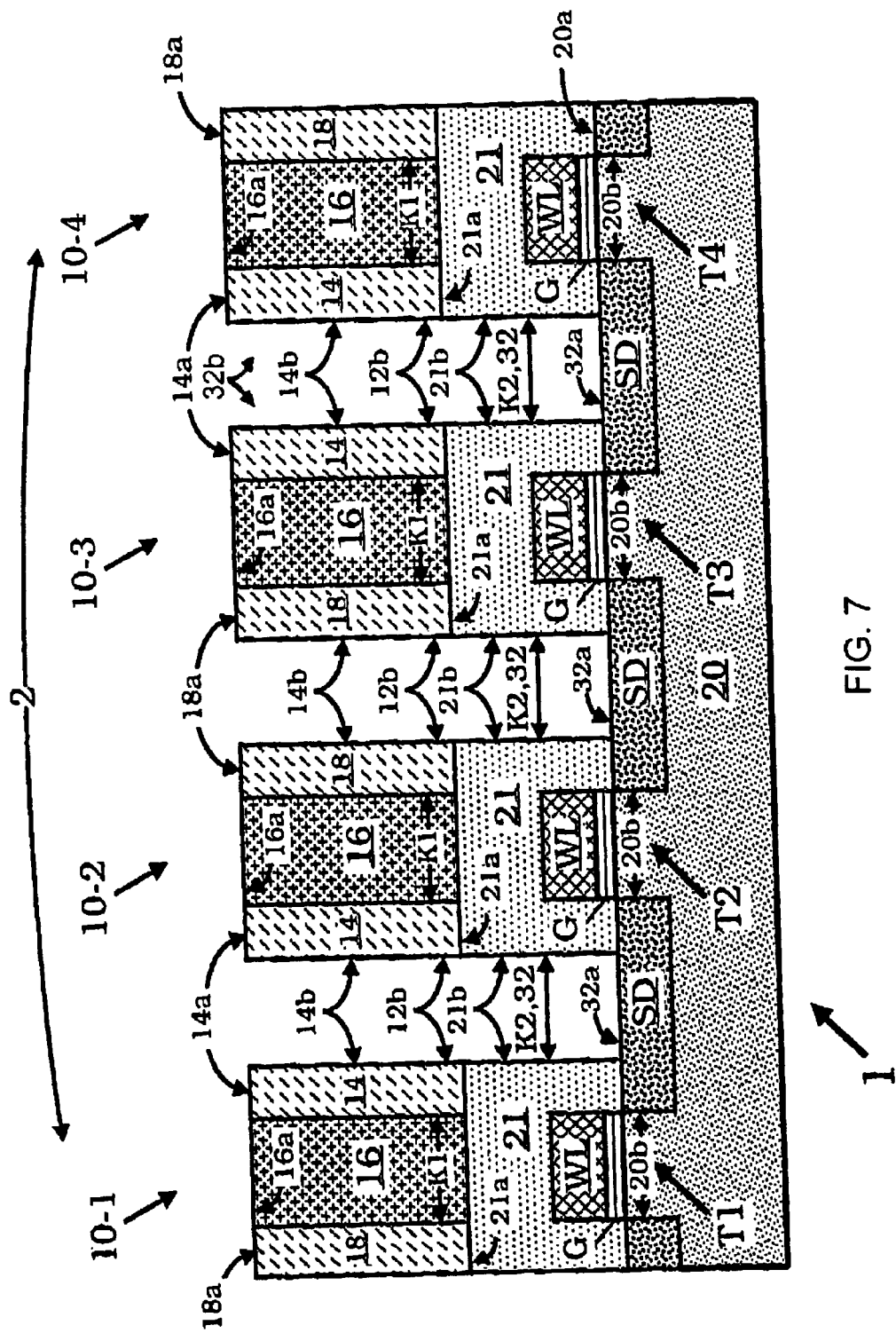

FIG. 7 shows a further intermediate state in the performance of the fabrication method according to the invention, in which second cutouts 32 are formed by selective etching in the region of the second defined locations K2. The second cutouts 32 extend in a manner proceeding from the level of the surface regions 14a, 16a, 18a as far as the surface region 20a of the semiconductor substrate 20 and, in particular, as far as the surface region 32a of the source/drain region SD of the selection transistors T1, . . . , T4. In this case, the edges 32b of the cutouts 32 are formed by edge regions 14b, 18b and 21b of the first and second electrode devices 14 and 18 and also of the first passivation region 21.

Figure 8:
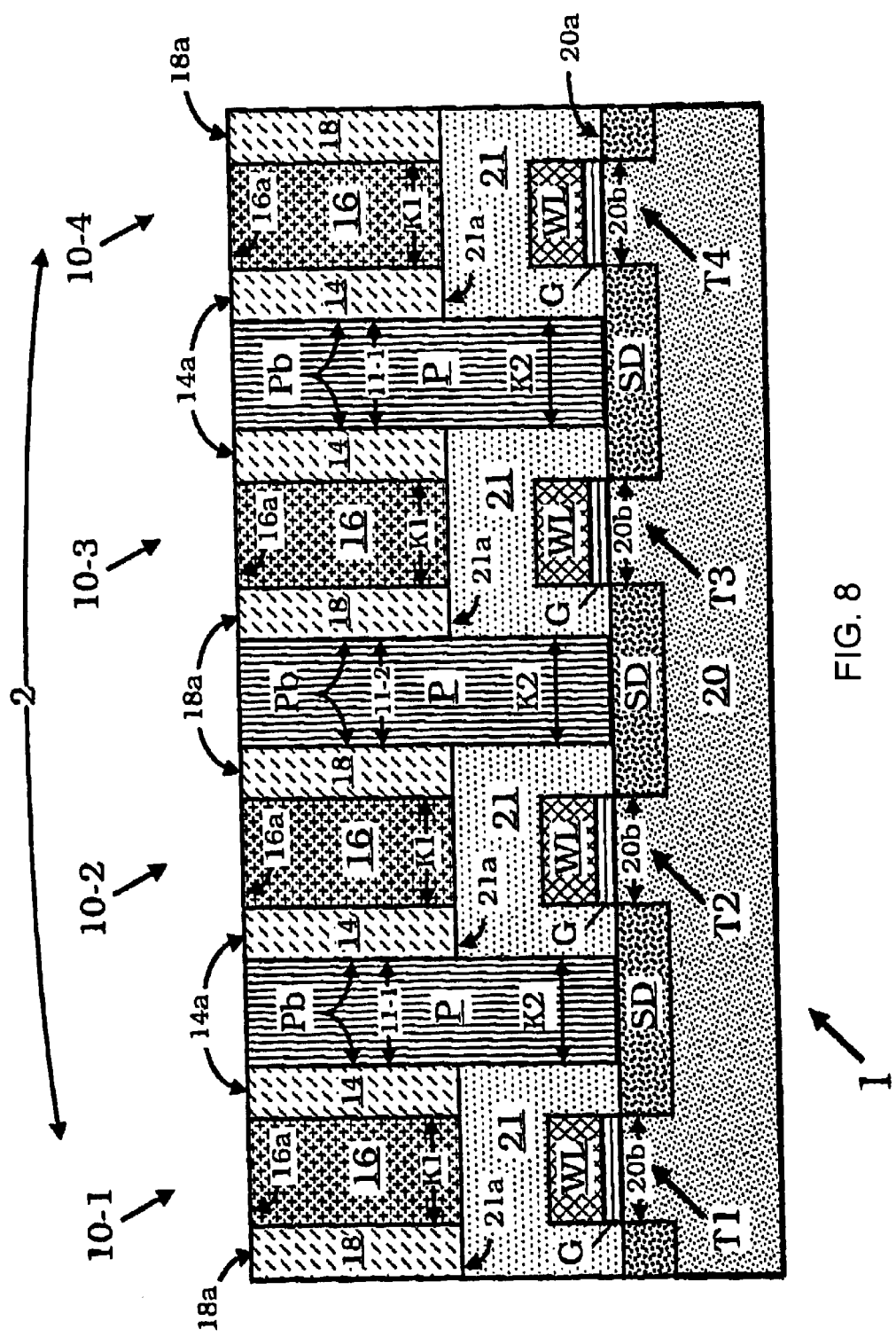

Afterward, a further material layer of a conductive material is then applied in a substantially two-dimensional, conformal, large-area and/or whole-area manner. In particular, the second cutouts 32 in the region of the second predefined locations K2 are completely filled such that a substantially electrically conductive contact or plug region P from the first electrode devices 14 or the second electrode devices 18 to one another and to the respective assigned source/drain regions SD is produced and overall a chain structure can be realized for the capacitor devices 10-1 to 10-4 of the capacitor configuration 2 that have been formed, as is shown in FIG. 8.

Figure 9:
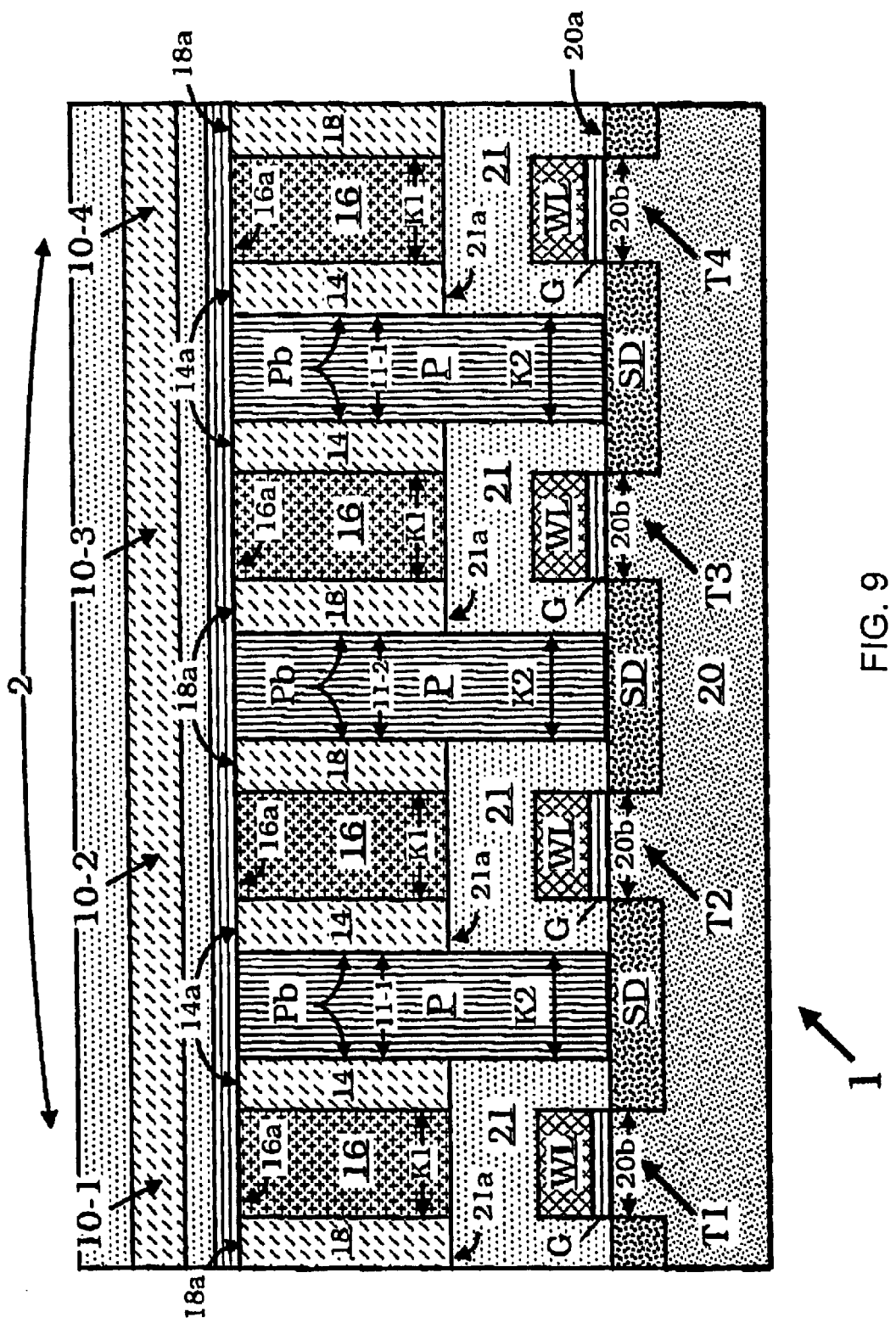

Finally, FIG. 9 shows a further intermediate stage of the fabrication method according to the invention, in which additional barrier, insulation, and contact layers are formed for interconnection purposes.

A further important aspect of the present invention is that a corresponding dielectric material, in particular, a ferroelectric, can be influenced in terms of its crystallization by an underlying layer and can, thus, be constructed in a desired manner in terms of its crystal properties. In particular, it has been shown by corresponding surface structure analyses and spectroscopic examinations that, for example, PZT on $Al_2O_3$ crystallizes in the [111] direction. The overall result is an identification of the material system $Al_2O_3$/PZT as material system for a vertical chain FeRAM capacitor concept.

If appropriate, $Al_2O_3$ could also be deposited following the intermediate state shown in FIG. 2; in that case, during etching in the transition from the state of FIG. 3 to the state of FIG. 4, a stop would have to be effected on $Al_2O_3$ so that the layer remains. Because $Al_2O_3$ is extremely hard, such an embodiment is certainly possible.

The patterning of the barrier layers, in particular, with the aid of a bowl structure or the like, produces a particularly advantageous process sequence. As an alternative, the same advantageous configuration can be achieved by a recess process with ARC or with photoresist: in this case, firstly a recess or a cutout is formed in the already completed plug region. Afterward, a TiN layer is applied by sputtering. This is followed by the deposition of a resist and the further formation of a cutout or a recess. The TiN recess subsequently follows. The resist is then removed and is followed by the deposition of iridium, for example, by sputtering and a subsequent planarization step by CMP.

It is also possible for three barrier layers to be buried in a vertical capacitor configuration. In such a case, the material combination for the barriers, the electrode, and the ferroelectrics differs depending on whether no, one, two, or three barrier layers are intended to be formed.

The following special qualities result with regard to the patterning of the dielectric, in particular, the ferroelectric: high aspect ratios occur during etching, in particular, with regard to $4F^2$–$8F^2$ areas. What is important here is that the electrodes are not short-circuited by the double etching of the ferroelectric structures nor at any time do free-standing ferroelectric structures occur whose structure might not be durable and that might fall over.

One possible procedure in the patterning of the dielectric, in particular, the ferroelectric, is outlined in the following text.

After the large- or whole-area deposition of the $Al_2O_3$ barrier and of the ferroelectric, for example, in the form of PZT, an etching process is performed in a first patterning step to open regions vertically as far as the TiN/Ir barriers above the plug regions. This is followed by wet-chemical cleaning, in particular, of the PZT regions. This results in virtually vertical etching profiles, for example of 83–86° in the case of a Pt/PZT etching. Furthermore, a good selectivity of the oxide mask of more than 0.7:1 is provided.

Afterward, the electrode material, for example $IrO_2$, is deposited such that the cutouts between the PZT regions are filled with contact to the plugs. This may preferably be done by an MOCVD method or the like, preferably, in two-dimensional, large-area or whole-area form. If appropriate, planarization is subsequently effected with a stop on the surface of the PZT region, preferably, by a CMP method. As an alternative, patterning by an etching process is also conceivable. An annealing step is then also effected.

For the electrical isolation of the individual capacitors, the procedure is then as follows: an etching step with regard to the PZT regions first ensues. This is followed by a wet-chemical cleaning step for the PZT regions. A passivation layer, preferably, made of $Al_2O_3$, is then formed. This $Al_2O_3$ layer serves as a hydrogen barrier and also as a barrier against the formation of Pb silicates.

A further central concept of the present invention is the covering—that is optionally to be provided—of the vertical chain FeRAM capacitor structures with $Al_2O_3$. This layer serves, as has already just been mentioned, as a hydrogen barrier and as Pb silicate forming blocker.

We claim:

1. A method for fabricating a semiconductor memory device, which comprises:

forming at least one of a semiconductor substrate, a passivation region, and a surface region with a CMOS structure;

forming a capacitor configuration of a plurality of capacitor devices serving as storage elements in a region of the at least one of the semiconductor substrate, the passivation region, and the surface region;

at least one of forming and patterning respective ones of the capacitor devices at least one of partially and locally in a fashion extending substantially vertically with respect to the at least one of the horizontally extending semiconductor substrate, the passivation region, and the surface region, and, as a result, at least one of forming and patterning a three-dimensional configuration extending at least one of partially and locally into a third dimension with respect to the at least one of the semiconductor substrate, the passivation region, and the surface region for a respective one of the capacitor devices; and forming a contact connection of the capacitor devices and of the electrode devices with the CMOS structure by plug regions after production of the capacitor devices.

2. The method according to claim 1, which further comprises:

at least one of forming and patterning first and second electrode devices and a dielectric disposed between the first and second electrode devices of a respective one of the capacitor devices at least one of partially and locally in vertically extending fashion with respect to the at least one of the semiconductor substrate, the passivation region, and the surface region;

forming the sequence of the first electrode device, the dielectric, and the second electrode device of a respective one of the capacitor devices at least one of partially and locally in horizontally extending fashion with respect to the at least one of the semiconductor substrate, the passivation region, and the surface region and beside one another in the surface region of at least one of the semiconductor substrate and the passivation region.

3. The method according to claim 1, which further comprises at least one of partially covering and embedding at least one of the semiconductor substrate and a surface region of the semiconductor substrate and the CMOS structure in a two-dimensional manner with a planar surface region by at least one first top-situated and laterally extending passivation region of an electrically insulating material.

4. The method according to claim 1, which further comprises at least one of partially covering and embedding at least one of the semiconductor substrate and a surface region of the semiconductor substrate and the CMOS structure in a two-dimensional, whole-area manner with a planar surface region by at least one first top-situated and laterally extending passivation region of an electrically insulating material.

5. The method according to claim 3, which further comprises forming cutouts with an etching process in defined first locations in the top-situated second passivation region and spaced apart vertically from a level of one of the semiconductor substrate and of the surface region, and, as a result, forming electrically insulated elevated regions in the first passivation region at second defined locations between the defined first locations.

6. The method according to claim 5, which further comprises:
providing selection transistor devices having source/drain regions in the surface region of the semiconductor substrate; and
selecting, as the defined first locations, regions above and between the source/drain regions of the selection transistor devices and between the defined second locations of plug regions for a contact connection of the capacitor configuration to be formed with the CMOS structure of at least one of the semiconductor substrate and the surface region of the semiconductor substrate.

7. The method according to claim 6, which further comprises forming the cutouts spaced apart vertically from the level of the surface region of the semiconductor substrate and from at least one of a level of the source/drain regions and of at least one of gate and word line regions of the selection transistor devices.

8. The method according to claim 7, which further comprises forming the cutouts laterally at least partially at least as far as edge regions of the plug regions, and, as a result, providing edge regions of the cutouts as edge regions of the plug regions.

9. The method according to claim 5, which further comprises forming the cutouts laterally at least partially at least as far as edge regions of the plug regions, and, as a result, providing edge regions of the cutouts as edge regions of the plug regions.

10. The method according to claim 8, which further comprises depositing at least one material region for the electrode devices from at least one electrically conductive material, and covering the edge regions of the cutouts and the elevated regions in a conformal two-dimensional deposition method.

11. The method according to claim 10, wherein the at least one electrically conductive material is at least one of the group consisting of a metal and a metal oxide.

12. The method according to claim 9, which further comprises depositing at least one material region for the electrode devices from at least one electrically conductive material, and covering the edge regions of the cutouts and the elevated regions in a conformal, whole-area, two-dimensional deposition method.

13. The method according to claim 12, wherein the at least one electrically conductive material is at least one of the group consisting of a metal and a metal oxide.

14. The method according to claim 10, which further comprises eroding and removing at least laterally extending regions of the material region for the electrode devices by anisotropy etching-back to isolate ones of the electrode devices that are not to be contact-connected, and, as a result, forming vertically extending regions adjacent to the insulating elevated regions, by which the electrode devices are formed.

15. The method according to claim 14, which further comprises forming on lateral bottom regions of the cutouts a respective one of a barrier region and an insulation region for a dielectric to be provided by specific, anisotropic, and directed deposition and by using at least one electrically insulating material.

16. The method according to claim 15, which further comprises:

forming the at least one of the barrier region and the insulation region for the dielectric in a plurality of layers; and
forming the at least one of the barrier region and the insulation region for the dielectric in one of:
a topmost region remote from the semiconductor substrate; and
a surface region of the semiconductor substrate,
as a nucleation layer for the dielectric that is subsequently to be applied.

17. The method according to claim 16, which further comprises depositing, on a respective one of the at least one barrier region and insulation region for the dielectric, a material region for the dielectric in the form of a ferroelectric by two-dimensional deposition in a conformal form and a form filling the first cutouts as far as a level of a surface region of the first passivation region, and by subsequent polishing as far as the level of the surface region of the first passivation region, to form respectively a region for the dielectric between ones of the electrode devices.

18. The method according to claim 16, which further comprises depositing, on a respective one of the at least one barrier region and insulation region for the dielectric, a material region for the dielectric in the form of a ferroelectric by two-dimensional deposition in a conformal form, a whole-area form, and a form filling the first cutouts as far as a level of a surface region of the first passivation region, and by subsequent polishing as far as the level of the surface region of the first passivation region, to form respectively a region for the dielectric between ones of the electrode devices.

19. The method according to claim 18, which further comprises subjecting one of the material layer for the dielectric and the dielectric to a heat treatment process at elevated temperature and in a defined process atmosphere containing oxygen.

20. The method according to claim 18, which further comprises:
forming second cutouts at the defined second locations above the source/drain regions of the selection transistor devices by selective etching;
removing the electrically insulating and elevated regions to at least partially uncover edge regions of the electrode devices; and
eroding the first passivation region in a region of the defined second locations as far as a level of a surface of the semiconductor substrate to respectively uncover a surface region of the source/drain regions.

21. The method according to claim 20, which further comprises forming a material region of an electrically conductive material by two-dimensional deposition in a conformal form and a form respectively filling the second cutouts as far as the level of the surface region of the source/drain regions and by subsequent polishing as far as the level of the surface regions of the electrode devices and of the dielectric, and, as a result, electrically contact-connect together one of the first electrode devices and the second electrode devices opposite one another in the second cutouts with a respective one of the source/drain regions.

22. The method according to claim 20, which further comprises forming a material region of an electrically conductive material by two-dimensional deposition in a conformal form, a whole-area form, and a form respectively filling the second cutouts as far as the level of the surface region of the source/drain regions and by subsequent polishing as far as the level of the surface regions of the electrode devices and of the dielectric, and, as a result, electrically contact-connect together one of the first electrode devices and the second electrode devices opposite one another in the second cutouts with a respective one of the source/drain regions.

23. The method according to claim 1, which further comprises contact-connecting a respective first electrode device of at least some of the capacitor devices through a first contact element to the first electrode device of a first directly spatially adjacent one of the capacitor devices and a second electrode device of at least some of the capacitor devices through a second contact element to the second electrode device of a second directly spatially adjacent one of the capacitor devices to form the capacitor configuration in at least one of a partly connected structure and a chain structure.

24. The method according to claim 23, which further comprises respectively forming the first electrode devices contact-connected to one another and the second electrode devices as a substantially integral electrically conductive region together with a respective first contact element in each case together with a plug region.

25. A method for fabricating a chain FeRAM memory, which comprises:

forming at least one of a semiconductor substrate, a passivation region, and a surface region with a CMOS structure;

forming a capacitor configuration of a plurality of capacitor devices serving as storage elements in a region of the at least one of the semiconductor substrate, the passivation region, and the surface region;

at least one of forming and patterning respective ones of the capacitor devices at least one of partially and locally in a fashion extending substantially vertically with respect to the at least one of the horizontally extending semiconductor substrate, the passivation region, and the surface region, and, as a result, at least one of forming and patterning a three-dimensional configuration extending at least one of partially and locally into a third dimension with respect to the at least one of the semiconductor substrate, the passivation region, and the surface region for a respective one of the capacitor devices; and forming a contact connection of the capacitor devices and of the electrode devices with the CMOS structure by plug regions after production of the capacitor devices.

* * * * *